(12) United States Patent
Dong et al.

(10) Patent No.: US 7,719,902 B2
(45) Date of Patent: May 18, 2010

(54) ENHANCED BIT-LINE PRE-CHARGE SCHEME FOR INCREASING CHANNEL BOOSTING IN NON-VOLATILE STORAGE

(75) Inventors: Yingda Dong, Sunnyvale, CA (US); Man L. Mui, Santa Clara, CA (US); Jeffrey W. Lutze, San Jose, CA (US); Shinji Sato, Chigasaki (JP); Gerrit Jan Hemink, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 169 days.

(21) Appl. No.: 12/126,375

(22) Filed: May 23, 2008

(65) Prior Publication Data

US 2009/0290429 A1 Nov. 26, 2009

(51) Int. Cl.
*G11C 16/06* (2006.01)
(52) U.S. Cl. ............... 365/185.25; 365/185.27; 365/185.18; 365/185.11
(58) Field of Classification Search ............ 365/185.09, 365/185.2, 185.11, 185.18, 185.25, 185.27
See application file for complete search history.

(56) References Cited

U.S. PATENT DOCUMENTS

| | | | |
|---|---|---|---|
| 5,386,422 A | 1/1995 | Endoh et al. | |
| 5,477,499 A | 12/1995 | Van Buskirk et al. | |
| 5,570,315 A | 10/1996 | Tanaka et al. | |
| 5,774,397 A | 6/1998 | Endoh et al. | |
| 6,005,802 A | 12/1999 | Takeuchi et al. | |
| 6,046,935 A | 4/2000 | Takeuchi et al. | |
| 6,049,494 A | 4/2000 | Sakui et al. | |
| 6,222,762 B1 | 4/2001 | Guterman et al. | |
| 6,456,528 B1 | 9/2002 | Chen | |
| 6,487,117 B1 | 11/2002 | Choi et al. | |
| 6,522,580 B2 | 2/2003 | Chen et al. | |
| 6,567,314 B1 | 5/2003 | Ogura et al. | |
| 6,859,397 B2 | 2/2005 | Lutze et al. | |
| 6,917,542 B2 | 7/2005 | Chen et al. | |
| 6,950,346 B2 | 9/2005 | You | |

(Continued)

FOREIGN PATENT DOCUMENTS

EP 1912223 4/2008

OTHER PUBLICATIONS

International Search Report and Written Opinion of the International Searching Authority, dated Jul. 30, 2009, PCT Patent Application No. PCT/US2009/044999.

*Primary Examiner*—Tuan T Nguyen
*Assistant Examiner*—Toan Le
(74) *Attorney, Agent, or Firm*—Vierra Magan Marcus & DeNiro LLP

(57) ABSTRACT

Channel boosting is improved in non-volatile storage to reduce program disturb. A pre-charge module voltage source is used to pre-charge bit lines during a programming operation. The pre-charge module voltage source is coupled to a substrate channel via the bit lines to boost the channel. An additional source of boosting is provided by electromagnetically coupling a voltage from a conductive element to the bit lines and the channel. To achieve this, the bit lines and the channel are allowed to float together by disconnecting the bit lines from the voltage sources. The conductive element can be a source line, power supply line or substrate body, for instance, which receives an increasing voltage during the pre-charging and is proximate to the bit lines.

23 Claims, 15 Drawing Sheets

U.S. PATENT DOCUMENTS

| | | |
|---|---|---|
| 6,956,770 B2 | 10/2005 | Khalid et al. |
| 6,996,003 B2 | 2/2006 | Li et al. |
| 7,023,736 B2 | 4/2006 | Cernea et al. |
| 7,046,568 B2 | 5/2006 | Cernea |
| 7,064,980 B2 | 6/2006 | Cernea et al. |
| 7,196,928 B2 | 3/2007 | Chen |
| 7,196,931 B2 | 3/2007 | Cernea et al. |
| 7,206,235 B1 * | 4/2007 | Lutze et al. ............ 365/195 |
| 7,233,522 B2 | 6/2007 | Chen et al. |
| 7,237,074 B2 | 6/2007 | Guterman et al. |
| 7,251,160 B2 | 7/2007 | Li et al. |
| 7,327,619 B2 | 2/2008 | Chan et al. |
| 2004/0174748 A1 | 9/2004 | Lutze |
| 2006/0140007 A1 | 6/2006 | Cernea et al. |
| 2008/0159003 A1 * | 7/2008 | Dong et al. ............ 365/185.25 |
| 2008/0159004 A1 * | 7/2008 | Hemink et al. ......... 365/185.25 |

* cited by examiner

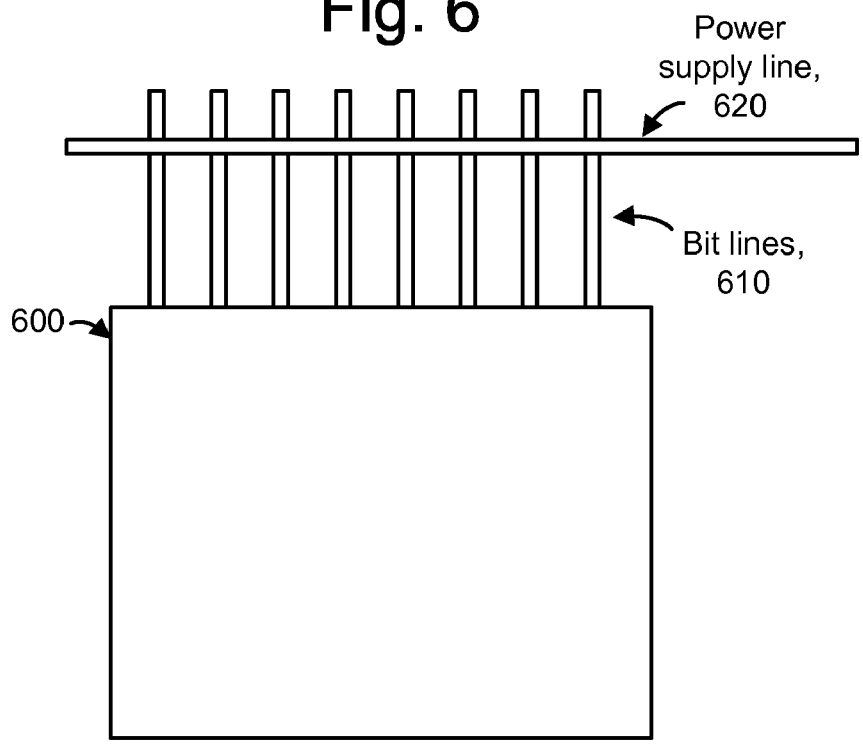
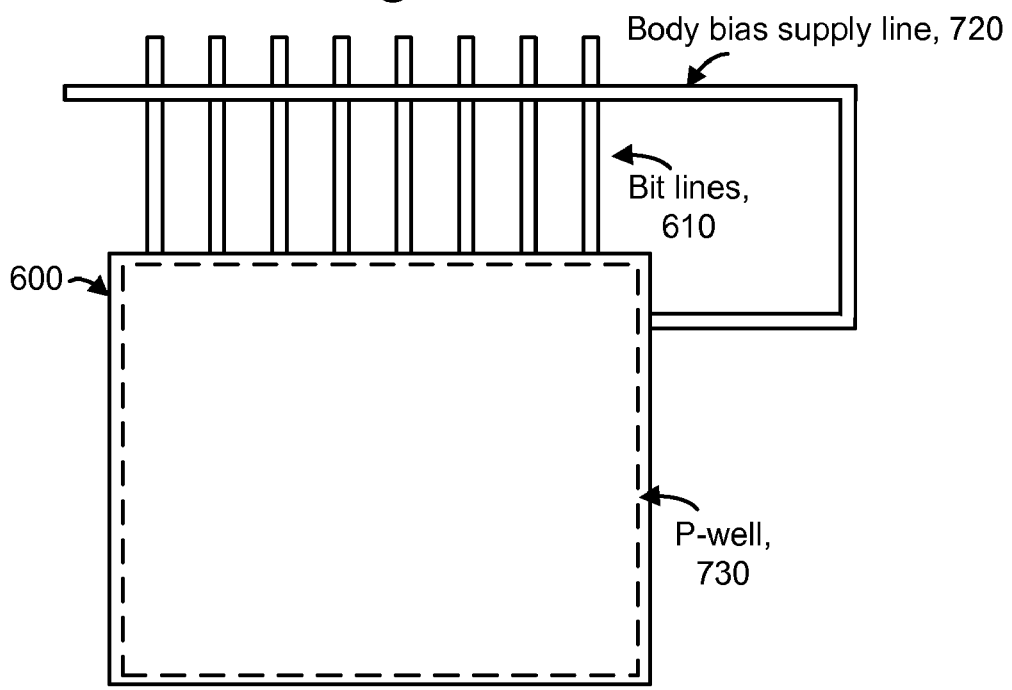

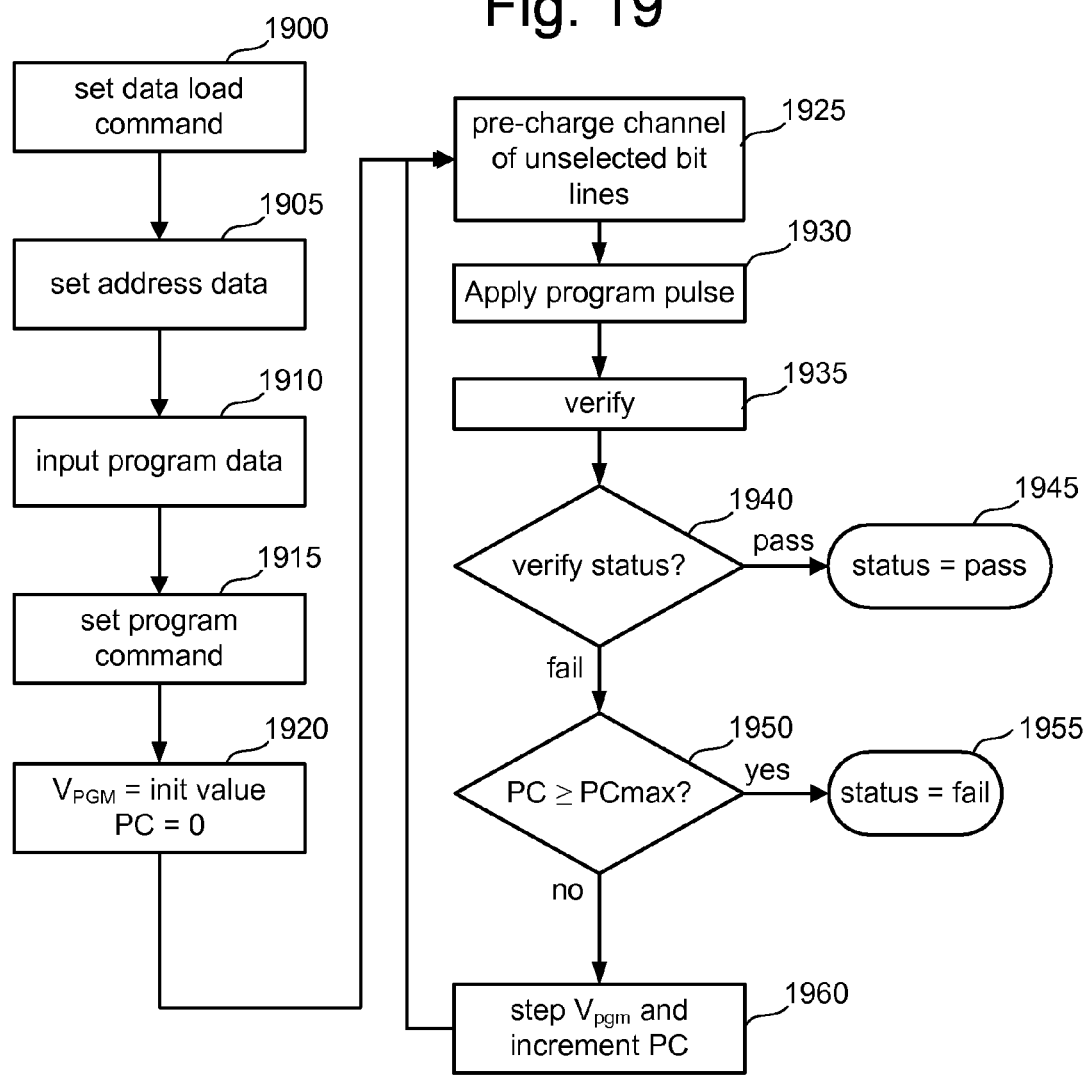
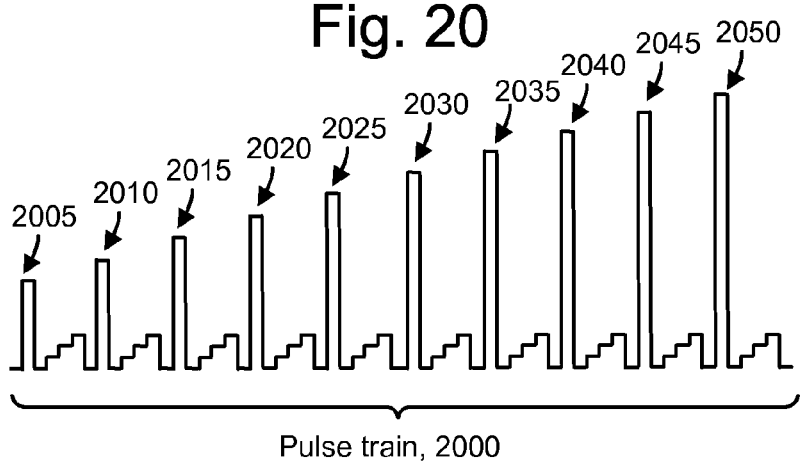

ENHANCED BIT-LINE PRE-CHARGE SCHEME FOR INCREASING CHANNEL BOOSTING IN NON-VOLATILE STORAGE

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

However, one issue which continues to be problematic is program disturb. Program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. One approach involves boosting the channel region of unselected NAND strings. However, the need for a large voltage source to provide channel boosting conflicts with the need for smaller device dimensions.

SUMMARY OF THE INVENTION

The present invention addresses the above and other issues by providing a method for improving channel boosting to reduce program disturb in a non-volatile storage system.

In one embodiment, a method is provided for performing a programming operation involving a set of non-volatile storage elements and a set of associated bit lines, including at least one selected bit line and at least one unselected bit line. The method includes, during a first time period, allowing the at least one selected bit line and the at least one unselected bit line to float while electromagnetically coupling a voltage to the at least one selected bit line and the at least one unselected bit line from at least one conductive element, and while allowing communication between the at least one unselected bit line and an associated channel region of the set of non-volatile storage elements. The method further includes, during a second time period which is after the first time period, driving the at least one selected bit line and the at least one unselected bit line while preventing communication between the at least one unselected bit line and the associated channel region, and applying a program voltage to at least one of the non-volatile storage elements which is associated with the at least one selected bit line.

In another embodiment, a method is provided for performing a programming operation involving a set of non-volatile storage elements and a set of associated bit lines. The method includes, in a first time period, electrically connecting the bit lines to respective voltage sources. The method further includes, in a second time period which follows the first time period, floating the bit lines by electrically disconnecting the bit lines from the respective voltage sources. The method further includes, in a third time period which follows the second time period, electrically re-connecting the bit lines to the respective voltage sources and applying a program voltage to at least one of the non-volatile storage elements. The first, second and third time periods occur during a programming operation of the at least one of the non-volatile storage elements, and the programming operation is repeated in order to program the non-volatile storage elements to target data states.

In another embodiment, a method is provided for performing a programming operation involving a set of NAND strings. The method includes: (a) driving at least one unselected NAND string with a pre-charge voltage via a first conductive element which is electrically connected to the at least one unselected NAND string, thereby boosting a voltage of a channel region of a substrate on which the at least one unselected NAND string is formed. The method further includes: (b) further boosting the voltage of the channel region by raising a voltage on a second conductive element which is proximate to a first conductive element, while floating the first conductive element and the at least one unselected NAND string, so that a portion of the raised voltage is electromagnetically coupled to the first conductive element and the at least one unselected NAND string. The method further includes: (c) after step (b), discontinuing the floating of the first conductive element, and applying a program voltage to a selected word line which is in communication with the at least one unselected NAND string.

In another embodiment, a non-volatile storage system includes a set of non-volatile storage elements, a set of associated bit lines, including at least one selected bit line and at least one unselected bit line, at least one conductive element, and at least one control. The at least one control: (a) during a first time period, allows the at least one selected bit line and the at least one unselected bit line to float while a voltage is electromagnetically coupled to the at least one selected bit line and the at least one unselected bit line from the at least one conductive element, and allows communication between the at least one unselected bit line and an associated channel region of the set of non-volatile storage elements. Further, the at least one control: (b) during a second time period which is after the first time period, drives the at least one selected bit line and the at least one unselected bit line, prevents communication between the at least one unselected bit line and the associated channel region, and applies a program voltage to at least one of the non-volatile storage elements which is associated with the at least one selected bit line.

Corresponding methods, systems and computer- or processor-readable storage devices for performing the methods provided herein may be provided.

BRIEF DESCRIPTION OF THE DRAWINGS

FIG. 6 depicts a memory device in which electromagnetic coupling is provided from a power supply line to bit lines.

FIG. 7 depicts a memory device in which electromagnetic coupling is provided from a body bias supply line to bit lines.

FIG. 19 is a flow chart describing one embodiment of a process for programming non-volatile memory.

FIG. 20 depicts an example pulse train applied to the control gates of non-volatile storage elements during programming.

DETAILED DESCRIPTION

The present invention provides a method for improving channel boosting to reduce program disturb in a non-volatile storage system.

Figure 1:
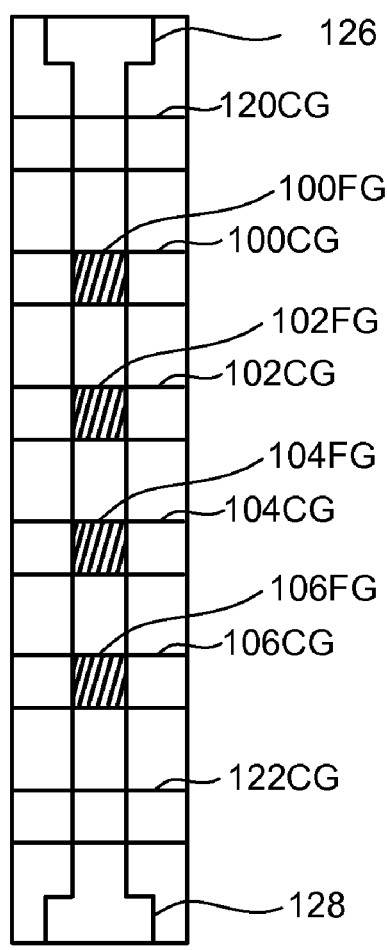
FIG. 1 is a top view of a NAND string.
Figure 2:
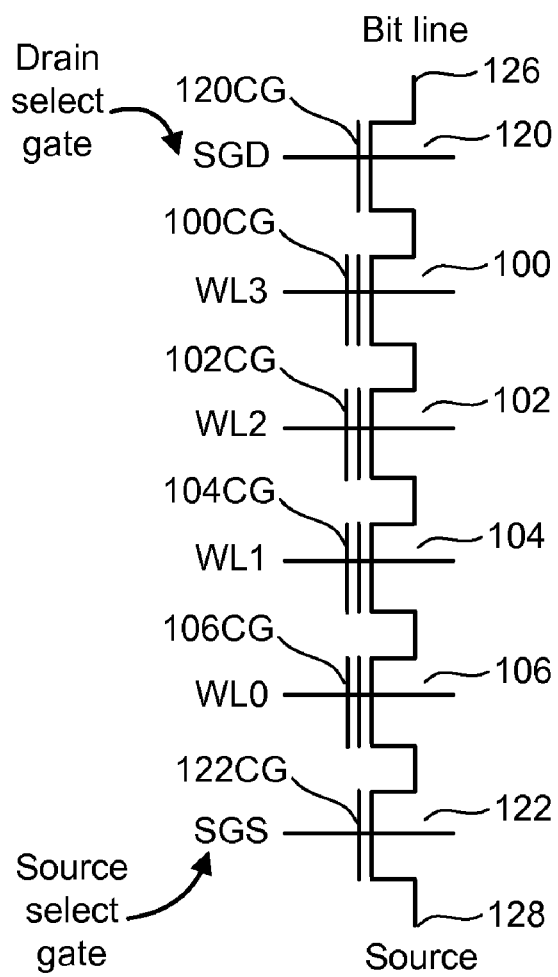
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
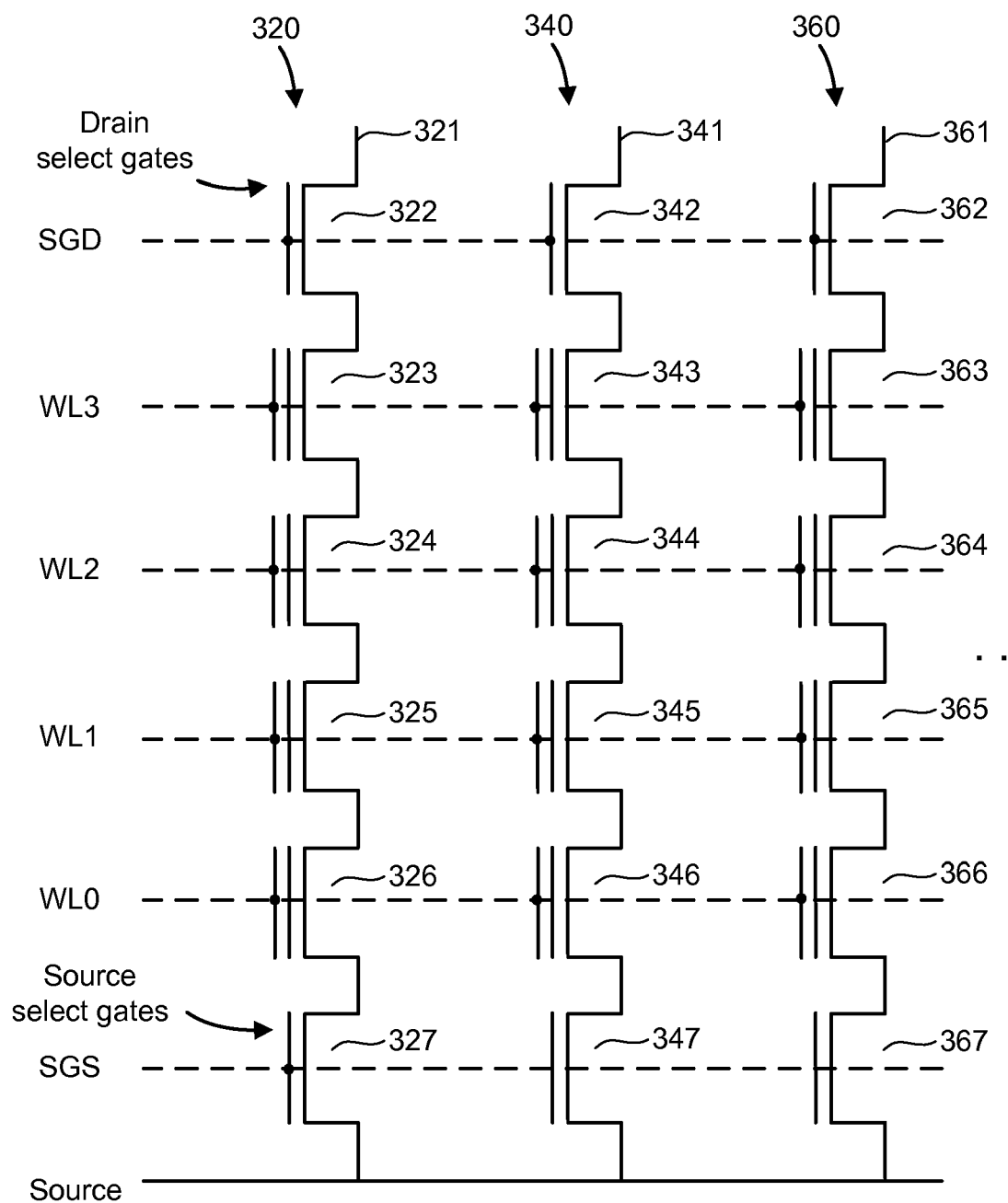
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb.

Figure 4:
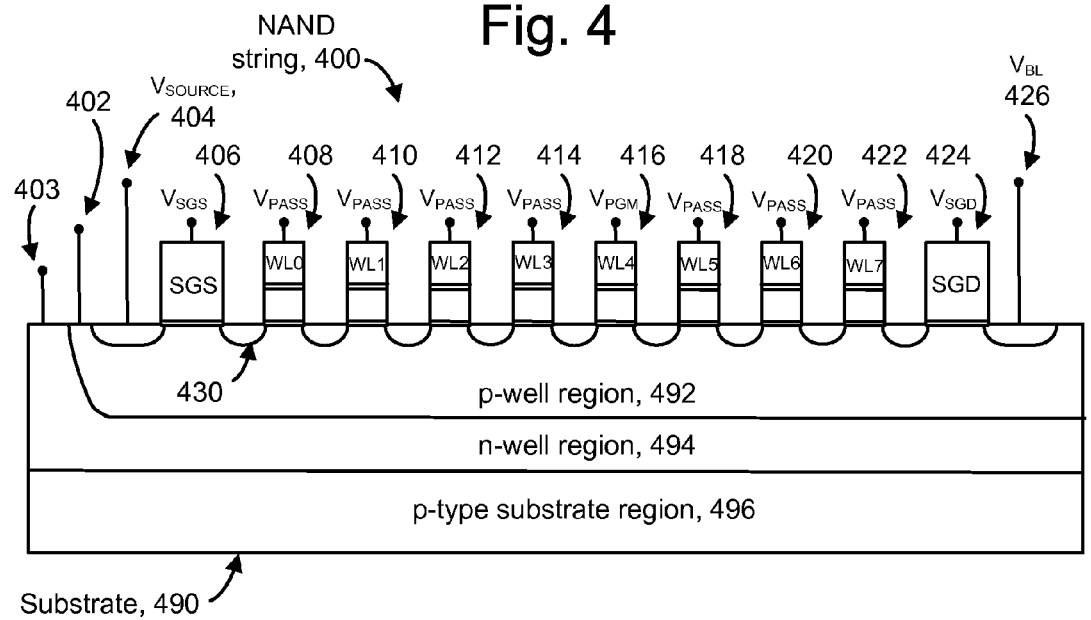
FIG. 4 depicts a cross-sectional view of a NAND string formed on a substrate.

FIG. 4 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 492 via a terminal 402 and/or to the n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. Some boosting schemes apply different pass voltages to different word lines. $V_{SGS}$ and $V_{SGD}$ are applied to the select gates 406 and 424, respectively.

Figure 5:
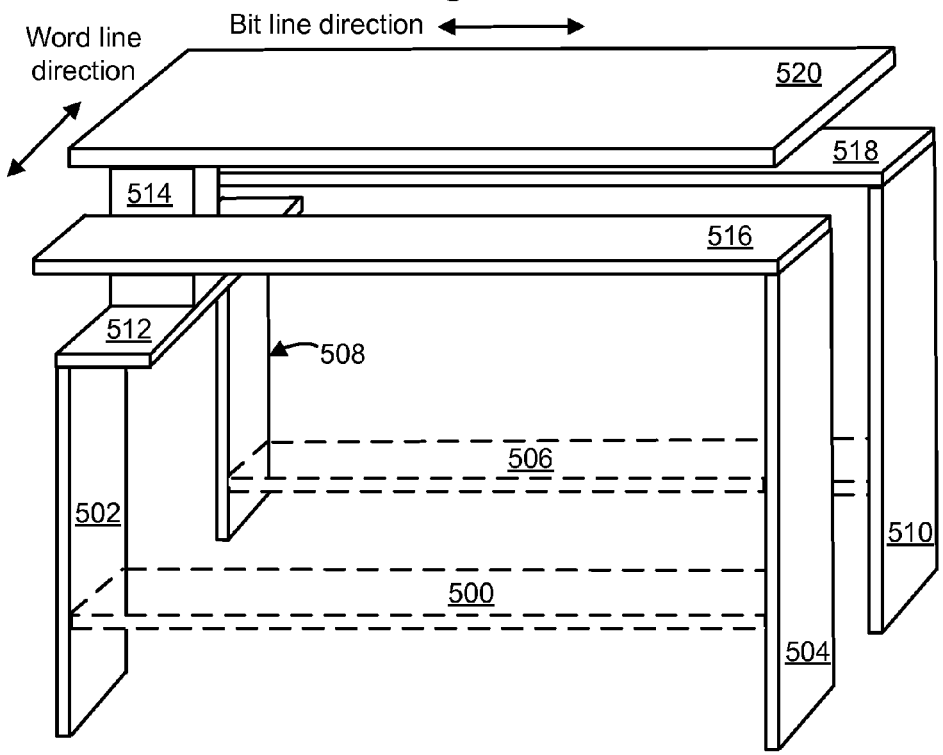
FIG. 5 depicts a memory device in which electromagnetic coupling is provided from a source line to bit lines.

FIG. 5 depicts a memory device in which electromagnetic coupling is provided from a source line to bit lines. The memory device includes an example NAND string 500 which extends between a bit line portion 504 and a source line portion 502, and an example NAND string 506 which extends between a bit line portion 510 and a source line portion 508. Additional NAND strings and bit lines can be provided in the word line direction, which is depicted. The source line portions are each connected to a common shunt portion 512 which can be a metallization layer. The shunt portion 512 is connected to a source line metallization layer 520 via a junction 514. The bit line portions 504 and 510 are connected to additional bit line portions 516 and 518, respectively, which can be in a bit line metallization layer. The additional bit line portions 516 and 518 and the source line metallization layer 520 both extend generally parallel to one another in a bit line direction, as depicted, and are proximate to one another, in one possible approach. The bit line portions 504 and 510, and the source line portions 502 and 508, may extend down to contact the silicon substrate.

In this configuration, electromagnetic coupling from the source line metallization layer 520 to the additional bit line portions 516 and 518 will occur when a changing voltage or current is applied to the source line metallization layer 520. Generally, a changing voltage or current in one conductive element results in an electromagnetic field which can cause a voltage or current in another proximate conductive element. The strength of such electromagnetic coupling, also referred to as capacitive coupling or RF coupling, can be defined by a coupling ratio of 0-1, where 0 indicates 0% coupling and 1 indicates 100% coupling. The strength of the electromagnetic coupling will be based on factors including the magnitude of the change in the voltage, the rate of change, the distance between the conductive elements, the size, orientation and material of the conductive elements and the presence of any intermediate blocking element. For example, greater coupling may be experienced when two conductive elements extend parallel to one another than when they extend perpendicular to one another.

In the geometry of FIG. 5, the coupled voltage is communicated from the bit line portions 516 and 518 to the bit line portions 504 and 510, respectively. With appropriate control of the memory device, the electromagnetic coupling can be provided to the NAND strings 500 and 506 as well to boost channel regions of the NAND strings during programming. While different memory devices have different layouts, typically some electromagnetic coupling is present and can be harnessed for this purpose.

FIG. 6 depicts a memory device in which electromagnetic coupling is provided from a power supply line to bit lines. Here, a set of bit lines 610 is associated with a set of storage elements 600. Further, a power supply line 620 extends across and above the bit lines 610. The power supply line 620 does not contact the bit lines 610, but may be sufficiently close to provide electromagnetic coupling to the bit lines 610. Further, an equal amount of coupling may be provided to each bit line. The power supply line 620 can provide power to any component in the memory device.

FIG. 7 depicts a memory device in which electromagnetic coupling is provided from a body bias supply line to bit lines. Here, a body bias supply line 720 extends across and above the bit lines 610. For example, as mentioned in connection with FIG. 4, a body bias voltage may be supplied to a p-well and/or n-well of a memory device. These wells are in a body of a substrate on which the set of non-volatile storage elements is formed. Again, the body bias supply line 720 is shown as extending perpendicular to the bit lines, but other configurations may be used. Generally, the conductive element which provides the electromagnetic coupling can extend parallel, perpendicular or in any other orientation to the bit line portions to provide coupling to the bit lines.

The use of a source line, power supply line, or body bias supply line are shown as examples only, as other voltage-carrying conductive elements could be used as well depending on the configuration of the memory device. Further, it is possible to provide electromagnetic coupling from more than one source. For example, both a source line and a power supply line can provide coupling to the bit lines. Moreover, note that the coupling to the bit lines can include coupling to any conductive element which is electrically connected to the bit lines. It is also desirable to have a generally equal coupling to the different bit lines to preclude bit-line-to bit line coupling, although this is not required, as unequal coupling can provide benefits as well.

Figure 8:
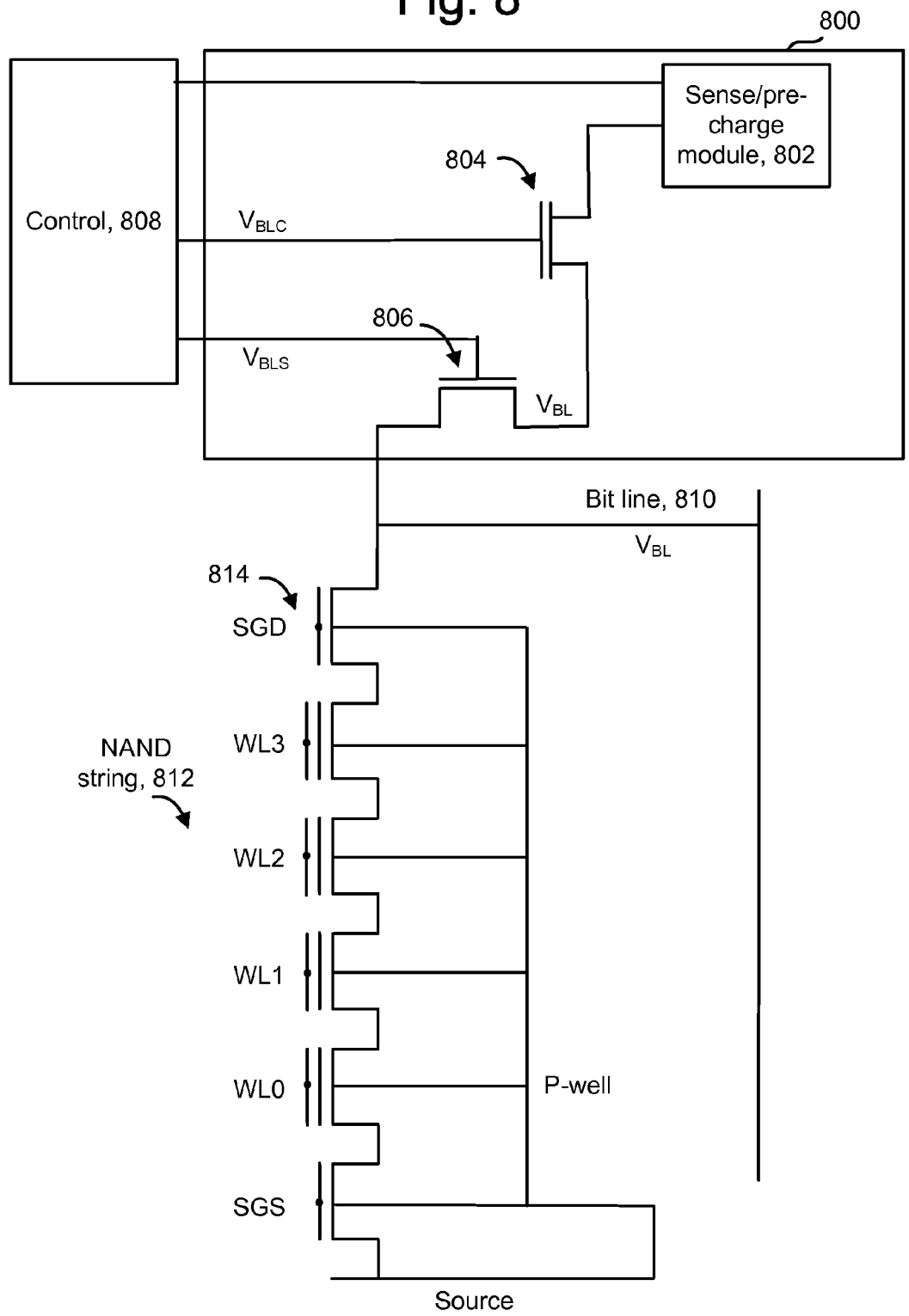
FIG. 8 depicts a configuration of a NAND string and components for pre-charging.

FIG. 8 depicts a configuration of a NAND string and components for pre-charging. To understand how electromagnetic coupling to a bit line impacts performance, a pre-charge procedure is now discussed. Pre-charging generally occurs for unselected bit lines, e.g., bit lines which are not associated with storage elements which are being programmed. In a simplified example, a NAND string 812 includes four storage elements which are in communication with word lines WL0, WL1, WL2 and WL3, respectively. The storage elements are coupled to a p-well region of a substrate. A bit line 810 having a voltage $V_{BL}$ is depicted, in addition to sense components 800, which are used during both sensing, e.g., verify or read operations, and during the pre-charging phase of a programming operation. The sense components 800 include a sensing/pre-charge module 802, a BLC (bit line control) transistor 804 and a BLS (bit line sense) transistor 806. The BLC transistor 804 is a low voltage transistor which is made conductive in response to the control 808 to allow pre-charging of a capacitor in the sensing/pre-charge module 802. The sensing/pre-charge module 802 may thus be considered to provide a voltage source. Once the sensing/pre-charge module 802 is pre-charged, the BLS transistor 806 is made conductive to share the charge with the bit line. The drain select gate (SGD) transistor 814 is also made conductive so that the charge is shared with the channel of the NAND string, thereby boosting the voltage of the channel. As mentioned, such channel boosting reduces program disturb of the unselected NAND strings.

However, the highest voltage which can typically be used in the pre-charge is the supply voltage $V_{DD}$. Use of a higher voltage requires a higher voltage transistor in the sense component 800. This is undesirable as such transistors require additional valuable space due to the need for a thicker oxide layer and other differences. A technique for enhancing pre-charging, described next, addresses these issues.

Figure 9:
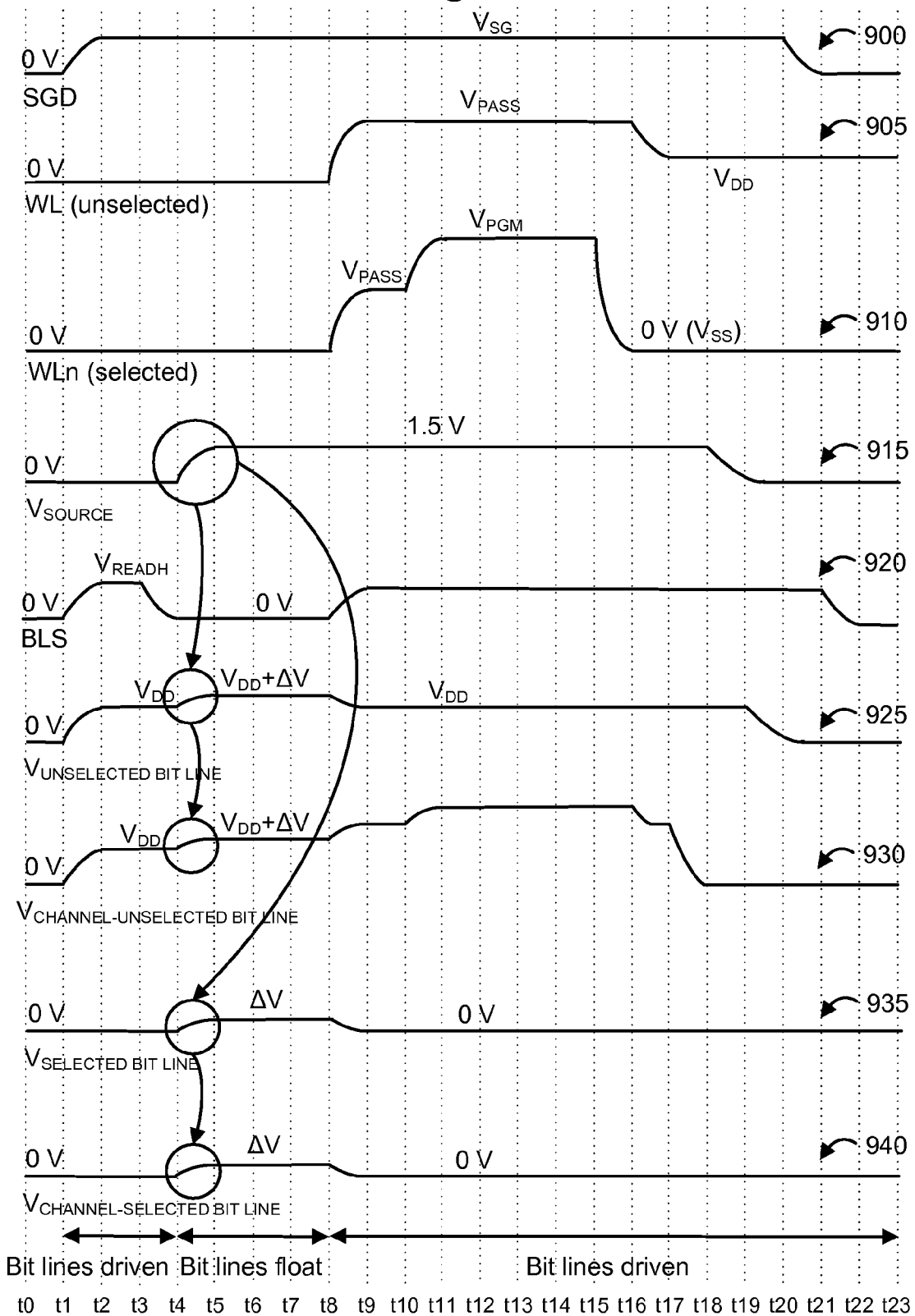
FIG. 9 depicts a time line of voltages in which electromagnetic coupling is used to enhance channel boosting during programming.

FIG. 9 depicts a time line of voltages in which electromagnetic coupling is used to enhance channel boosting during programming.

As non-volatile storage devices such as NAND flash memory continue to scale down, channel boosting tends to becomes more difficult when the coupling between two neighboring channels becomes stronger. Further, when boosting efficiency is lower, a higher $V_{PASS}$ needs to be used on the unselected word lines to prevent program disturb caused by insufficient channel boosting. However, a high $V_{PASS}$ can cause $V_{PASS}$ disturb in the selected channels, and is therefore not desirable. Therefore, increasing boosting efficiency without using a higher $V_{PASS}$ voltage is desirable.

Newer memory devices experience significant floating gate-to-floating gate and floating gate-to-channel coupling which can impair performance. To keep the threshold voltage ($V_{TH}$) of an erased storage element below 0 V after the neighboring storage elements finish programming, the storage element $V_{TH}$ should be very low after erase, e.g., below −3 V. Deeply erased storage elements normally can increase boosting efficiency. However, under some channel boosting pre-charge schemes, where 0 V is applied to word lines and $V_{DD}$ is applied to inhibited bit lines, when the erased storage element's $V_{TH}$ is lowered to a certain level, its benefit to the channel boosting will saturate because the voltage on the bit line ($V_{DD}$) is not high enough. It is therefore desirable to use an enhanced bit line pre-charge method to fully utilize the deep erased storage elements' low $V_{TH}$ to help increase the channel boosting efficiency.

A two-step pre-charge scheme is proposed. This approach can be used in an odd-even configuration, in which storage elements associated with odd numbered bit lines are programmed separately from storage elements associated with even numbered bit lines, or in an all bit line (ABL) configuration, in which storage elements associated with all bit lines in a block can be programmed at the same time. See also FIG. 15. In either approach, one or more bit lines are considered to be selected bit lines if they are associated with storage elements which are selected to be programmed. Otherwise, the bit lines are considered to be unselected.

The time line of FIG. 9 includes several waveforms which are aligned with respect to a time axis along the bottom of the figure. Initially, before time t0, the sense/pre-charge module 802 (FIG. 8) is charged to a level of $V_{DD}$ (e.g., 2.5 V). In the time period t1-t4, the inhibited bit lines are driven and charged up to $V_{DD}$. Specifically, the voltages are raised on the SGD transistors, e.g., from 0 V to $V_{SG}$, (waveform 900), and on the BLS transistors, e.g., from 0 V to a positive level referred to as $V_{READH}$, (waveform 920) for the unselected bit lines, to make these transistors conductive and allow charge sharing with the unselected bit lines (waveform 925) and the associated channel regions (waveform 930). In this manner, the voltage of the unselected bit lines is also raised to $V_{DD}$. Note that $V_{SG}$ should also be high enough to keep the SGD transistor conductive when the unselected bit line voltage increases to $V_{DD}+\Delta V$, as discussed below. It is possible to provide $V_{SG}$ at the same level from t1-t20 or to temporarily increase it between t4-t8 when the unselected bit line voltage increases due to coupling. The selected bit lines (waveform 935) and associated channels (waveform 940) are not charged during t1-t4. Further, $V_{SOURCE}$ (waveform 915) remains at 0 V, as do the voltages on the unselected and selected word lines (waveforms 905 and 910, respectively). Note that $V_{SOURCE}$ is depicted as this example as we assume the source line voltage is used for coupling. However, in other cases where another conductive element is used for electromagnetic coupling to the bit lines, the waveform 915 will represent the corresponding voltage.

Between times t4-t8, the bit lines are allowed to float, e.g., they are not driven with a specific zero or non-zero voltage. That is, the voltage on the bit lines is allowed to float without being maintained at a set point. In one implementation, this includes allowing all bit lines to float, whether an odd-even or all bit line approach is used. Note that if some bit lines are floated and others are not, bit line-to-bit line coupling may occur. Moreover, such coupling would likely dominant the source line-to-bit line coupling. Additionally, at t4, $V_{SOURCE}$ is raised from 0 V to a level such as 1.5 V, causing electromagnetic coupling to the floating bit lines. Since the bit lines are floating, their voltage is raised based on the change in $V_{SOURCE}$ and the coupling ratio CR of the source line to the bit lines. The increase in the bit line voltage and the corresponding increase in the channel voltage can be expressed by:

$\Delta V = f(\Delta V_{SOURCE}) \times CR$, where f is a function of the change in $V_{SOURCE}$ (i.e., $\Delta V_{SOURCE}$). In one example scenario, $\Delta V = 1$ V when $\Delta V_{SOURCE} = 1.5$ V, indicating a coupling ratio of ⅔ or 0.67. Thus, advantageously, a significant amount of additional boosting can be achieved.

Depending on the capability of the voltage driving circuitry, $V_{SOURCE}$ can be raised from 0 V to a higher level such as 2.0 V at t4 and then lowered to another level such as 1.5 V after t8. This provides a higher level of coupling without the need to maintain $V_{SOURCE}$ at an unnecessarily high level throughout the programming.

The arrow extending from waveform 915 to waveform 925 indicates how the raise in $V_{SOURCE}$ is coupled to the unselected bit line. The arrow extending from waveform 925 to waveform 930 indicates how the raise in the unselected bit line is transferred to the channel associated with the unselected bit line. Similarly, the arrow extending from waveform 915 to waveform 935 indicates how the raise in $V_{SOURCE}$ is coupled to the selected bit line, and the arrow extending from waveform 935 to waveform 940 indicates how the raise in the selected bit line is transferred to the channel associated with the selected bit line.

Note that channels of both the unselected and selected bit lines are raised by $\Delta V$, even though they started at different levels (unselected bit lines started at $V_{DD}$ and selected bit lines started at 0 V). Similarly, the bit line voltages will be coupled up together, even if they were to start at different levels. Thus, between t4 and t8, the bit lines are no longer driven and are instead allowed to float, and we use the voltage coupled to the bit lines from the source ($V_{SOURCE}$), or other conductive element in the memory device, such as a power supply line or body bias supply line, to raise the bit line voltage. The increase in the channel voltage associated with the selected bit line can be subsequently removed after t8 by driving the selected bit line at 0 V so as not to impair programming.

Subsequently, between t8 and t23, the bit lines are driven again and are thus no longer allowed to float. Also, $V_{PASS}$ and then a program voltage $V_{PGM}$ are applied to a selected word line, and pass voltages are applied to the unselected word lines. In one approach, the bit lines are driven at the same level as before they were floated, e.g., the selected bit lines are driven at 0 V (waveform 935) and the unselected bit lines are driven at $V_{DD}$ (waveform 925). Note that the selected bit lines can also be driven at a positive value to slow down programming, such as during the fine mode of a coarse/fine programming process. To drive the selected and unselected bit lines, the BLS transistor is made conductive at t8 (waveform 920) to electrically connect the bit lines with a voltage in the sense components. Between t8-t10, $V_{PASS}$ is applied to the word lines (waveforms 905 and 910), causing additional channel boosting for the channels of the unselected bit lines (waveform 930). Between t10-t15, $V_{PGM}$ is applied to the selected word line (waveform 910), causing further channel boosting for the channels of the unselected bit lines (waveform 930).

Under the above-mentioned implementation of a boosting scheme, $V_{SOURCE}$ is charged up to 1.5 V before $V_{PASS}$ ramps up. If all the bit lines are floating, about 1 V can be coupled to the bit lines from $V_{SOURCE}$. As a result, instead of using $V_{DD}$ (e.g., 2.5 V) to pre-charge the inhibited bit lines, now $V_{DD}+$ 1 V (e.g., 3.5 V) can be used. This can enhance the bit line pre-charge for deeply erased storage elements and increase the boosting strength.

Further, note that $V_{SOURCE}$ is normally raised during programming to close the source side select gate of a NAND string, so the additional channel boost which is gained from the electromagnetic coupling essentially is achieved at no cost. It is only necessary to configure the control to temporarily allow the bit lines to float, e.g., by electrically disconnecting the bit lines from the voltage source which are driving them. In one implementation, this is done by lowering the BLS transistor voltage between t4 and t8 to render the BLS transistor non-conductive, thereby electrically disconnecting the bit lines from the voltage sources.

Figure 10:
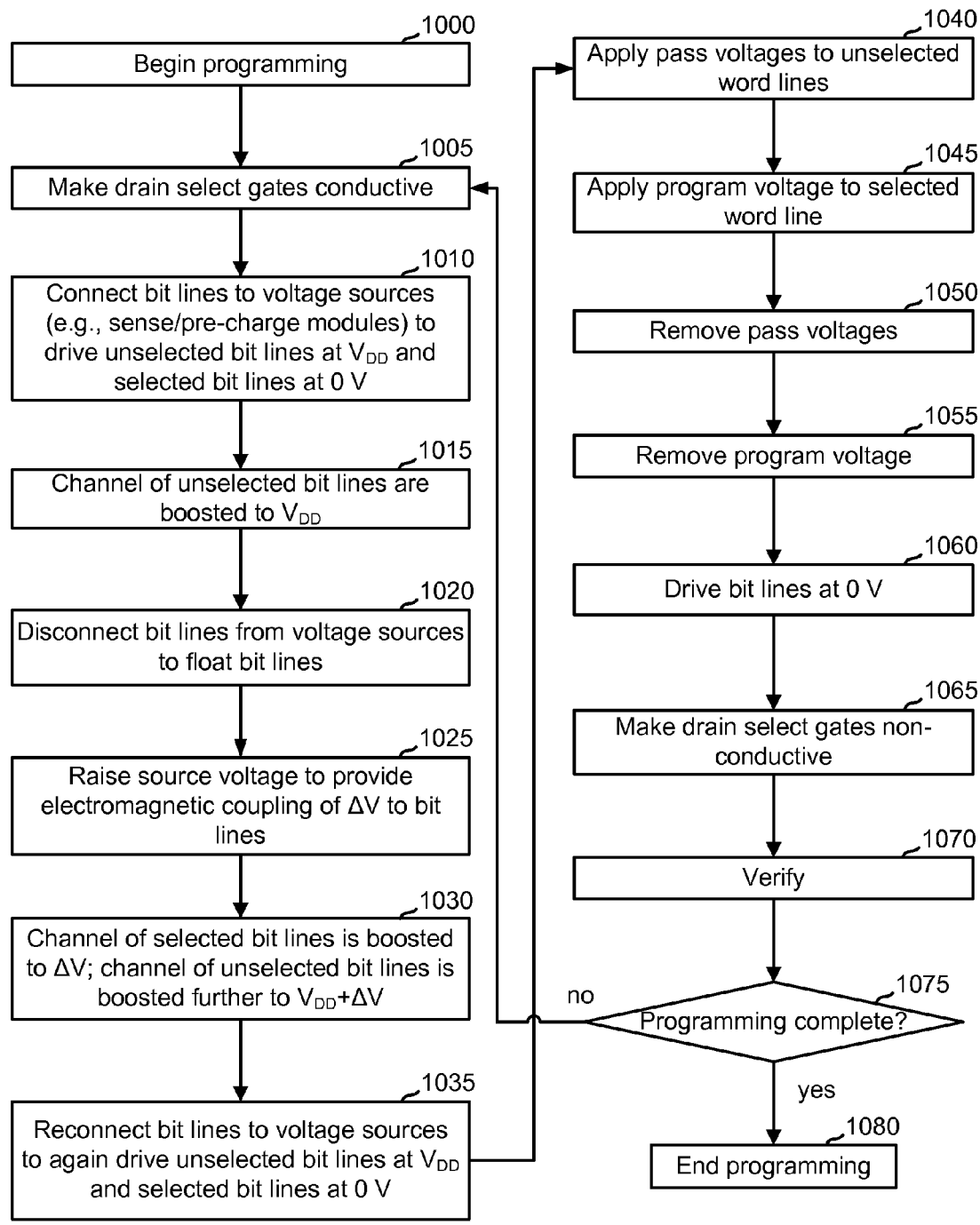
FIG. 10 depicts a programming process in which channel boosting is enhanced.

FIG. 10 depicts a programming process in which channel boosting is enhanced. Step 1000 includes beginning the programming process. Note that the steps are not necessarily performed separately. Step 1005 includes making the drain select gates conductive. Step 1010 includes connecting the bit lines to the sense/pre-charge module voltages to drive the unselected bit lines at $V_{DD}$ and the selected bit lines at 0 V, in one example approach. At step 1015, the channels of the unselected bit lines are boosted to $V_{DD}$. Step 1020 includes disconnecting the bit lines from the sense/pre-charge module voltages to float the bit lines. Step 1025 includes raising the source voltage, for instance, or the voltage on another conductive element, to provide electromagnetic coupling in the amount of ΔV to the bit lines. At step 1030, the channel of the selected bit lines is boosted to ΔV, and the channel of the unselected bit lines is boosted further to $V_{DD}$+ΔV. Step 1035 includes reconnecting the bit lines to the sense/pre-charge module voltages to again drive the unselected bit lines at $V_{DD}$ and the selected bit lines at 0 V.

Step 1040 includes applying pass voltages to the unselected word lines. Step 1045 includes applying a program voltage to the selected word line. Step 1050 includes removing the pass voltages, e.g., by driving the unselected word lines at $V_{DD}$ or 0 V, and step 1055 includes removing the program voltage, e.g., by driving the selected word line at 0 V. Step 1060 includes driving the bit lines at 0 V. Step 1065 includes making the drain select gates non-conductive. Subsequently, a verify operation is performed at step 1070 to determine whether the selected storage elements have reached the intended programming level/data state. If programming is complete at decision step 1075, e.g., all selected storage elements have reached the intended programming level/data state, then programming ends at step 1080. If programming is not complete at decision step 1075, another programming process is carried out beginning at step 1005.

Figure 11:
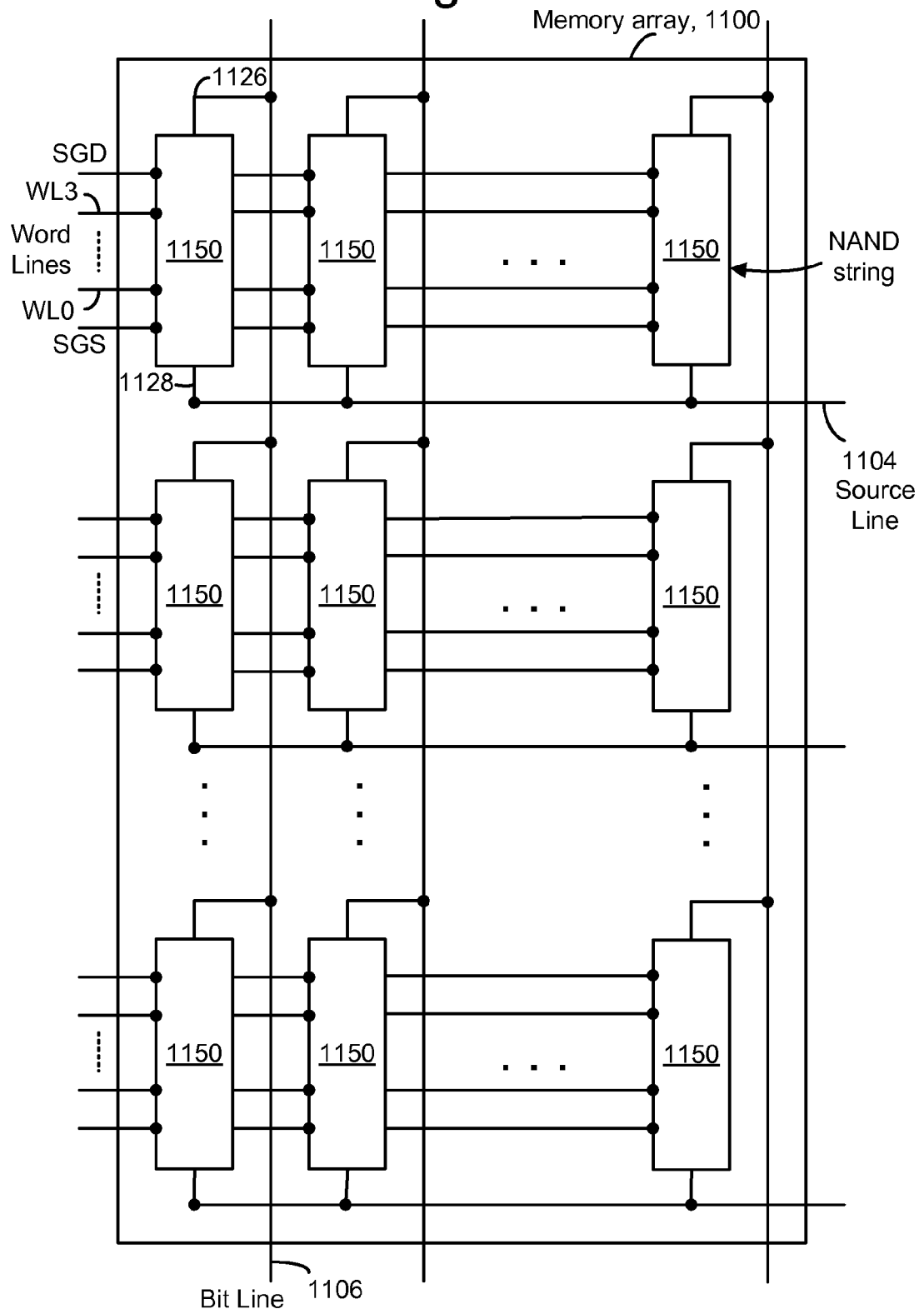
FIG. 11 is a block diagram of an array of NAND flash storage elements.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
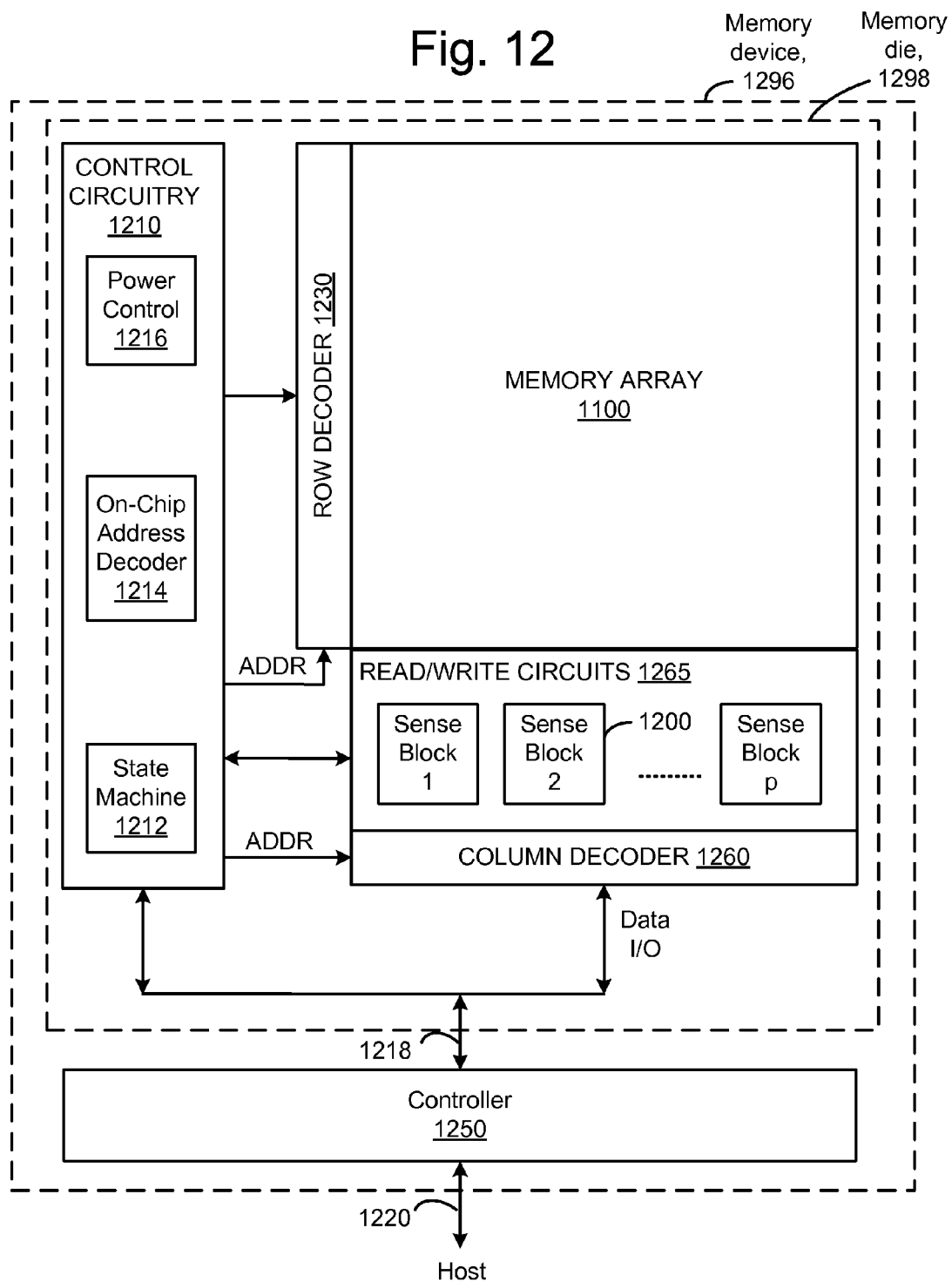
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214, and a power control module 1216. The state machine 1212 provides chip-level control of memory operations, including controlling pre-charging. The on-chip address decoder 1214 provides an address interface between that used by the host or a memory controller to the hardware address used by the decoders 1230 and 1260. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, etc.

Figure 13:
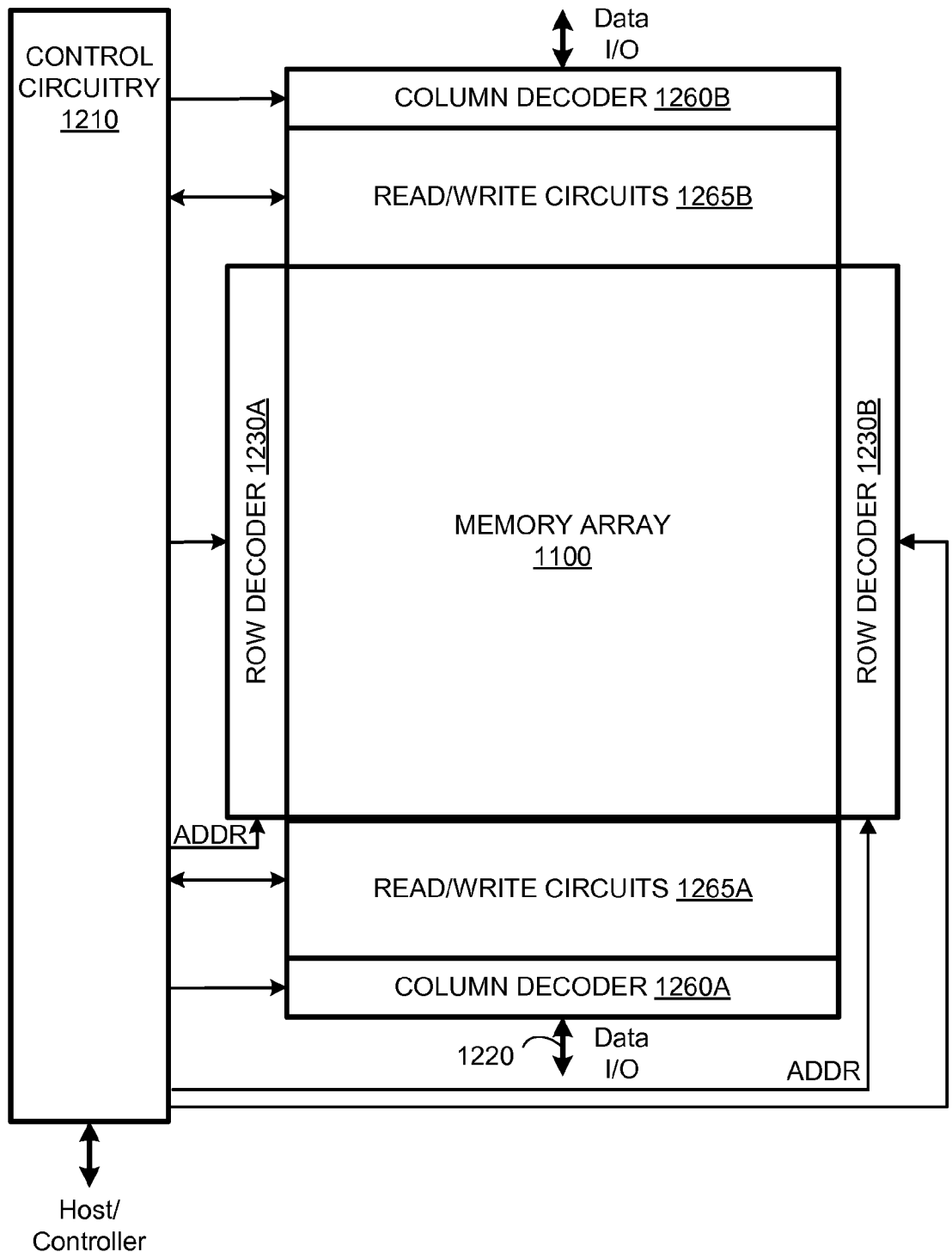
FIG. 13 is a block diagram of a non-volatile memory system using dual row/column decoders and read/write circuits.

FIG. 13 is a block diagram of a non-volatile memory system using dual row/column decoders and read/write circuits. Here, another arrangement of the memory device 1296 shown in FIG. 12 is provided. Access to the memory array 1100 by the various peripheral circuits is implemented in a symmetric fashion, on opposite sides of the array, so that the densities of access lines and circuitry on each side are reduced by half. Thus, the row decoder is split into row decoders 1230A and 1230B and the column decoder into column decoders 1260A and 1260B. Similarly, the read/write circuits are split into read/write circuits 1265A connecting to bit lines from the bottom and read/write circuits 1265B connecting to bit lines from the top of the array 1100. In this way, the density of the read/write modules is essentially reduced by one half. The device of FIG. 13 can also include a controller, as described above for the device of FIG. 12.

Figure 14:
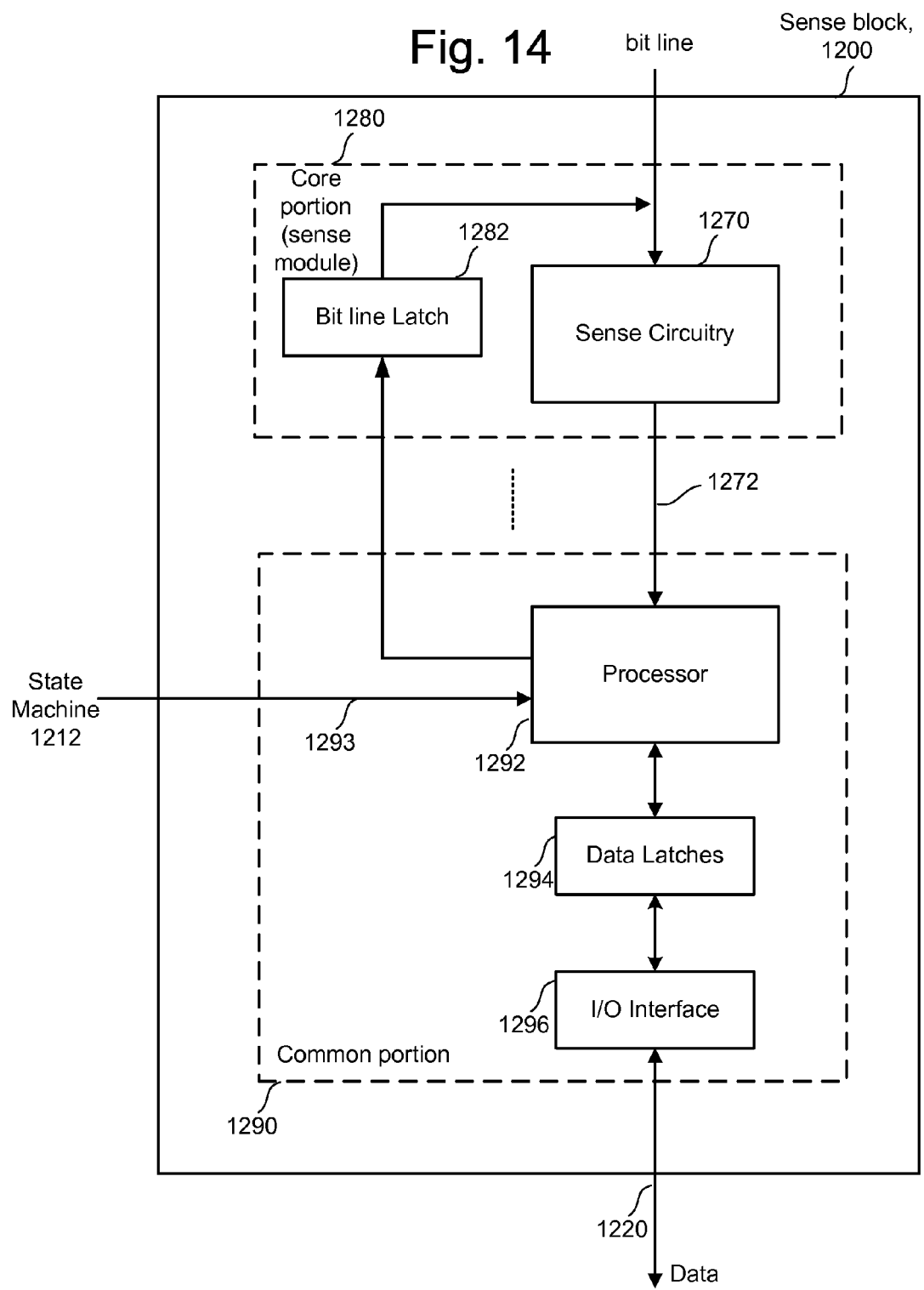
FIG. 14 is a block diagram depicting one embodiment of a sense block.

FIG. 14 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, titled, "Non-Volatile Memory And Method With Reduced Source Line Bias Errors," issued Mar. 27, 2007; (2) U.S. Pat. No. 7,023,736, title "Non-Volatile Memory And Method with Improved Sensing," issued Apr. 4, 2006; (3) U.S. Pat. No. 7,046,568, titled "Improved Memory Sensing Circuit And Method For Low Voltage Operation," issued May 16, 2006; (4) U.S. Pat. No. 7,196,928, titled "Compensating for Coupling During Read Operations of Non-Volatile Memory," issued Mar. 27, 2007; and (5) U.S. Pat. No. 7,327,619, titled "Reference Sense Amplifier For Non-Volatile Memory, issued Feb. 5, 2008. All five of the immediately above-listed patent documents are incorporated herein by reference in their entirety.

Figure 15:
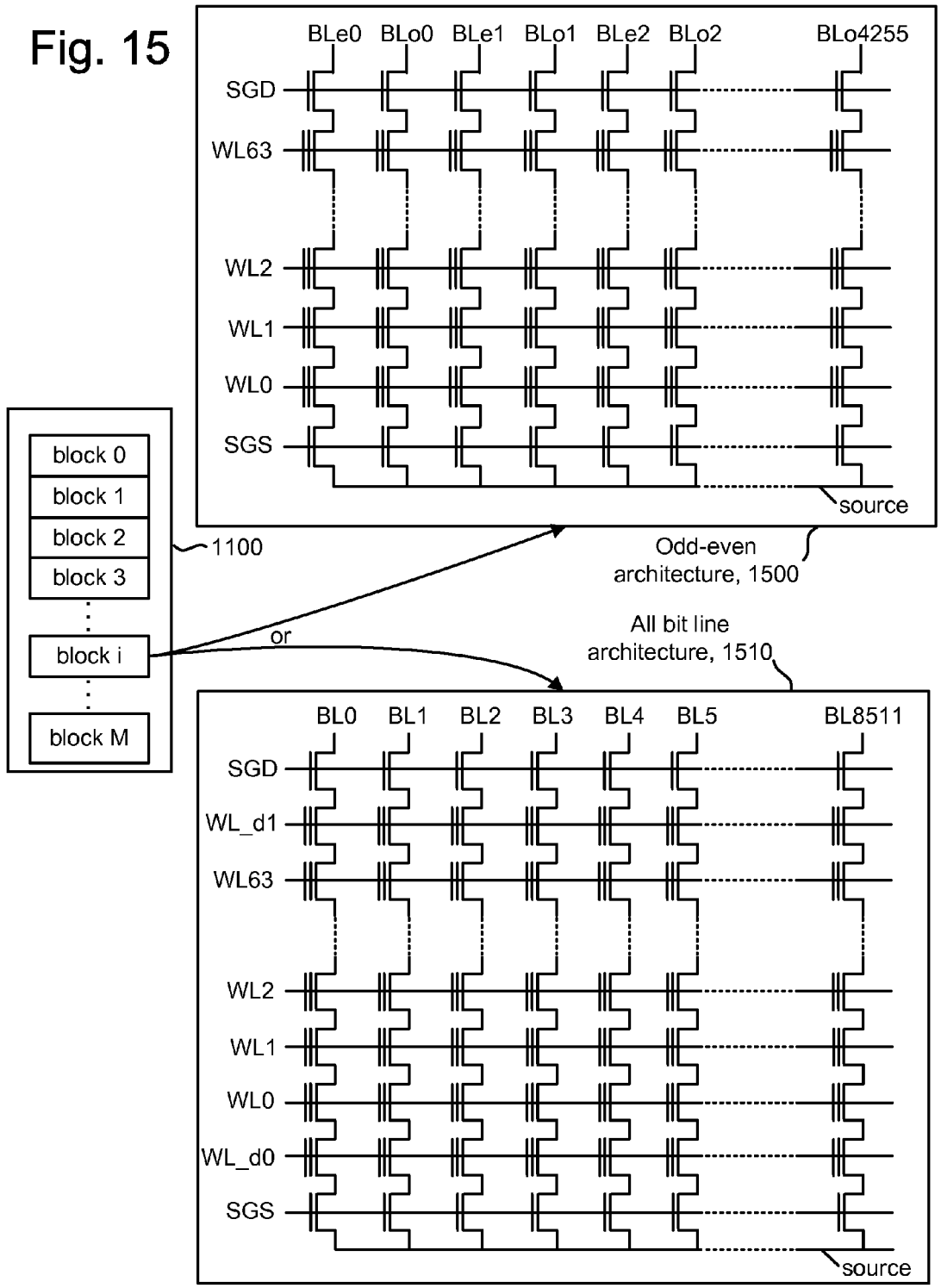
FIG. 15 illustrates an example of an organization of a memory array into blocks for an all bit line memory architecture or for an odd-even memory architecture.

FIG. 15 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1510), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1500), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 16:
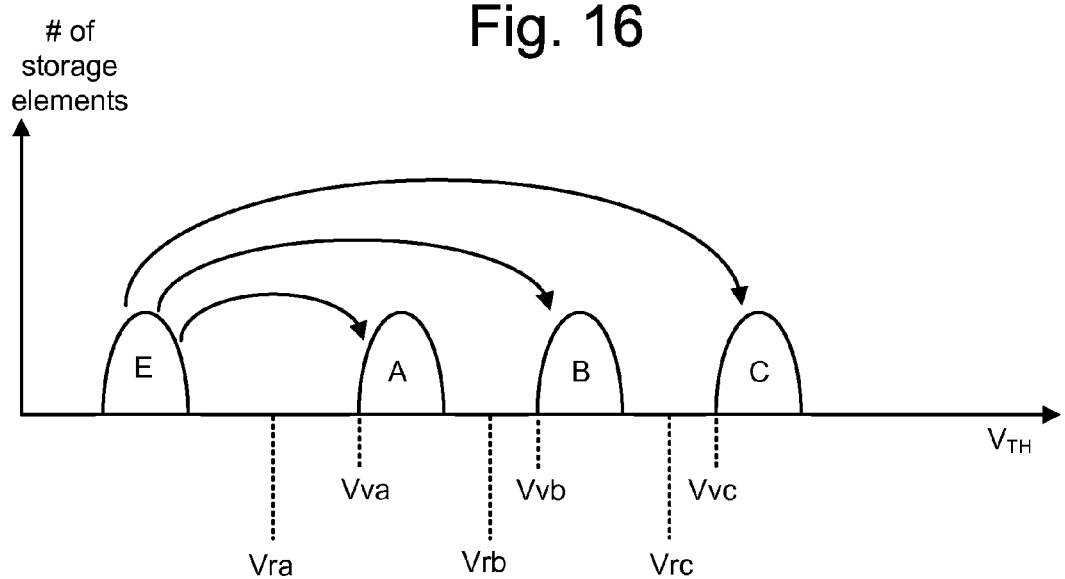
FIG. 16 depicts an example set of threshold voltage distributions and one-pass programming.

FIG. 16 depicts an example set of threshold voltage distributions and one-pass programming. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Pat. No. 7,237,074, issued Jun. 26, 2007, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 20 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn-1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 17:
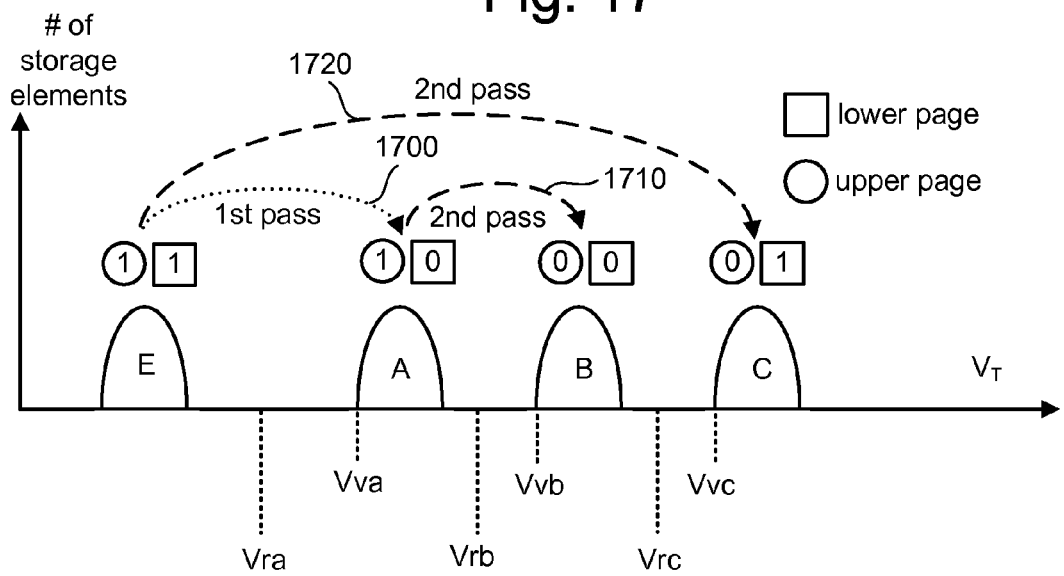
FIG. 17 depicts an example set of threshold voltage distributions and two-pass programming.

FIG. 17 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1700. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1720. If the storage element had been programmed into state A as a result of the first programming pass, then the storage element is further programmed in the second pass so that the threshold voltage is increased to be within state B, as depicted by arrow 1710. The result of the second pass is to program the storage element into the state designated to store a logic "0" for the upper page without changing the data for the lower page. In both FIG. 16 and FIG. 17, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Pat. No. 7,120,051, titled "Pipelined Programming of Non-Volatile Memories Using Early Data," issued Oct. 10, 2006, incorporated herein by reference in its entirety.

Figure 18A:
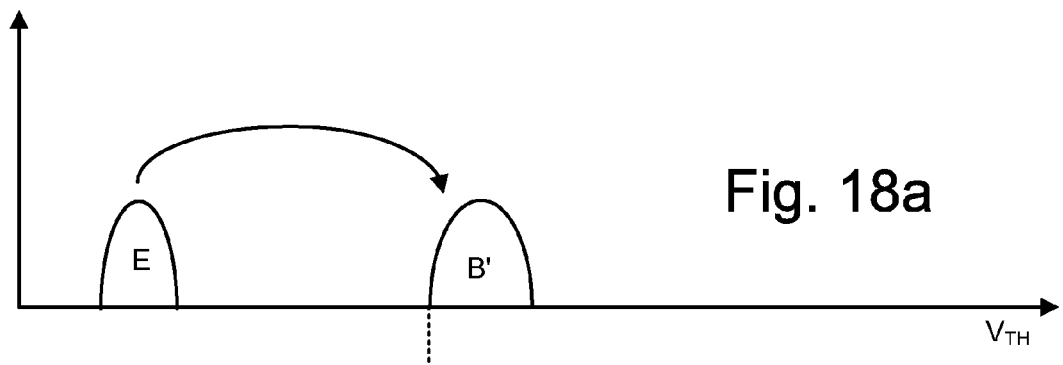
FIGS. 18a-c show various threshold voltage distributions and describe a process for programming non-volatile memory.
Figure 18B:
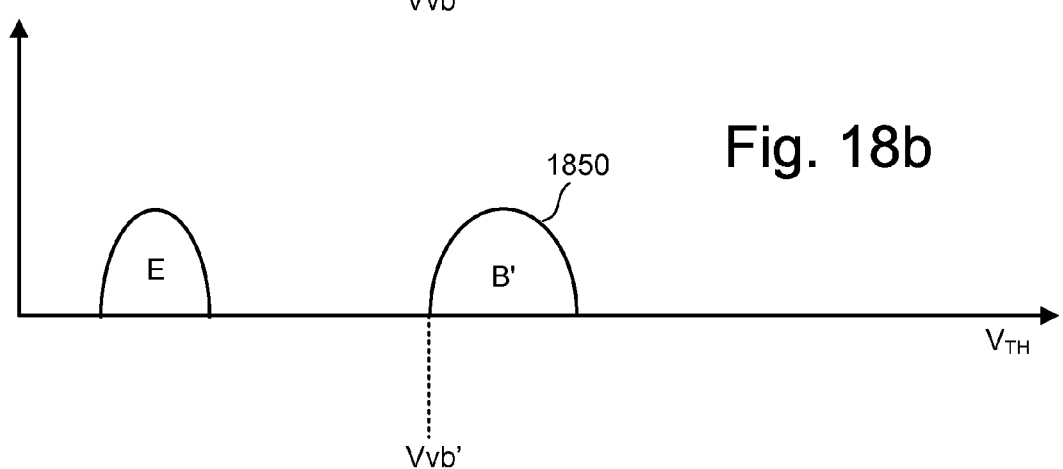
Figure 18C:
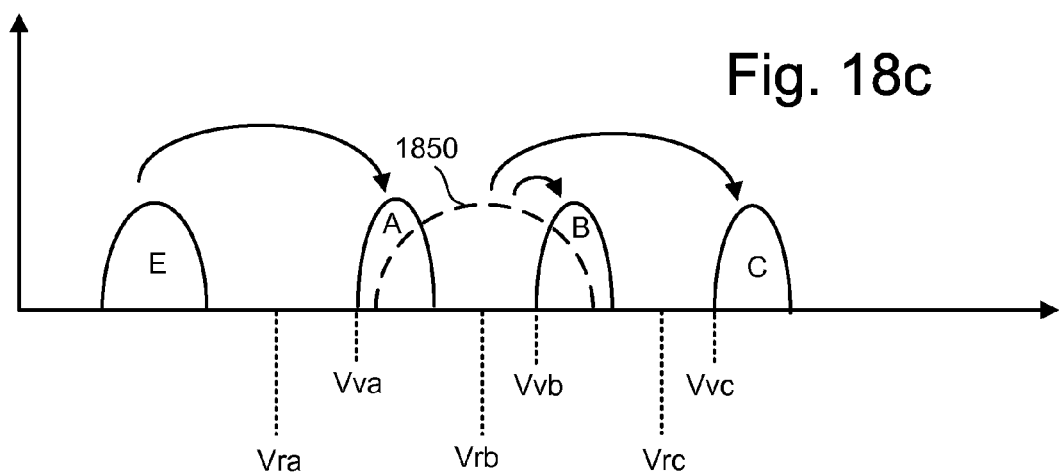

FIGS. 18a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 18a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1850 of FIG. 18b. This apparent widening of the threshold voltage distribution will be remedied when programming the upper page.

FIG. 18c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1850 and the upper page data is to remain at 1, then the storage element will be programmed to final state B. If the storage element is in intermediate threshold voltage distribution 1850 and the upper page data is to become data 0, then the threshold voltage of the storage element will be raised so that the storage element is in state C. The process depicted by FIGS. 18*a-c* reduces the effect of floating gate to floating gate coupling because only the upper page programming of neighbor storage elements will have an effect on the apparent threshold voltage of a given storage element. An example of an alternate state coding is to move from distribution 1850 to state C when the upper page data is a 1, and to move to state B when the upper page data is a 0.

Although FIGS. 18*a-c* provide an example with respect to four data states and two pages of data, the concepts taught can be applied to other implementations with more or fewer than four states and more or less than two pages.

FIG. 19 is a flow chart describing one embodiment of a method for programming non-volatile memory. In one implementation, storage elements are erased (in blocks or other units) prior to programming. In step 1900, a "data load" command is issued by the controller and input received by control circuitry 1210. In step 1905, address data designating the page address is input to decoder 1214 from the controller or host. In step 1910, a page of program data for the addressed page is input to a data buffer for programming. That data is latched in the appropriate set of latches. In step 1915, a "program" command is issued by the controller to state machine 1212.

Triggered by the "program" command, the data latched in step 1910 will be programmed into the selected storage elements controlled by state machine 1212 using the stepped program pulses of the pulse train 2000 of FIG. 20 applied to the appropriate selected word line. In step 1920, the program voltage, $V_{PGM}$, is initialized to the starting pulse (e.g., 12 V or other value) and a program counter (PC) maintained by state machine 1212 is initialized at zero. In step 1925, the channels of the unselected bit lines are pre-charged, as discussed previously. At step 1930, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1935, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1940, a check is made as to whether all of the data latches are storing logic "1." If all of the data latches are storing logic "1," the programming process is complete and successful because all selected storage elements were programmed and verified. A status of "PASS" is reported in step 1945. In some embodiments, the programming process is considered complete and successful even if not all selected storage elements were verified as being programmed. In such a case, errors during subsequent read operations can occur due to insufficient programmed storage elements. However, these errors can be corrected by ECC.

If, in step 1940, it is determined that not all of the data latches are storing logic "1," then the programming process continues. In some embodiments, the program process stops even if not all of the data latches are storing logic "1". In step 1950, the program counter PC is checked against a program limit value PCmax. One example of a program limit value is twenty; however, other numbers can also be used. If the program counter PC is not less than PCmax, then the program process has failed and a status of "FAIL" is reported in step 1955. If the program counter PC is less than PCmax, then $V_{PGM}$ is increased by the step size and the program counter PC is incremented in step 1960. The process then loops back to step 1930 to apply the next $V_{PGM}$ pulse.

FIG. 20 depicts an example pulse train applied to the control gates of non-volatile storage elements during programming. The pulse train 2000 includes a series of program pulses 2005, 2010, 2015, 2020, 2025, 2030, 2035, 2040, 2045, 2050, . . . , that are applied to a word line selected for programming. In one embodiment, the programming pulses have a voltage, $V_{PGM}$, which starts at 12 V and increases by increments, e.g., 0.5 V, for each successive programming pulse until a maximum of, e.g., 20-25 V is reached. In between the program pulses are verify pulses, e.g., three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 17) or Vvb' (FIG. 18*a*), for instance.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing a programming operation involving a set of non-volatile storage elements and a set of associated bit lines, including at least one selected bit line and at least one unselected bit line, comprising:

during a first time period, allowing the at least one selected bit line and the at least one unselected bit line to float while electromagnetically coupling a voltage to the at least one selected bit line and the at least one unselected bit line from at least one conductive element, and while allowing communication between the at least one unselected bit line and an associated channel region of the set of non-volatile storage elements; and during a second time period which is after the first time period, driving the at least one selected bit line and the at least one unselected bit line while preventing communication between the at least one unselected bit line and the associated channel region, and applying a program voltage to at least one of the non-volatile storage elements which is associated with the at least one selected bit line.

2. The method of claim 1, further comprising:

in a time period prior to the first time period, driving the at least one unselected bit line while allowing communication between the at least one unselected bit line and the associated channel region.

3. The method of claim 2, wherein:
the at least one unselected bit line and the at least one selected bit line are driven at the same respective levels in the time period before the first time period, and in the second time period.

4. The method of claim 1, wherein:
the allowing communication results in boosting of the associated channel region, and the allowing communication comprises providing, in a conductive state, a transistor which is electrically between the at least one unselected bit line and the associated channel region.

5. The method of claim 1, wherein:
the first time period, and the time period prior to the first time period, are part of a bit line pre-charge phase of the programming operation.

6. The method of claim 1, wherein the electromagnetically coupling in the first time period boosts the associated channel region to a first level, the method further comprising applying pass voltages to other non-volatile storage elements during at least part of the second time period to further boost the associated channel region.

7. The method of claim 1, wherein:
the electromagnetically coupling a voltage comprises raising a voltage on a source line associated with the set of non-volatile storage elements.

8. The method of claim 1, wherein:
the electromagnetically coupling a voltage comprises raising a voltage of a supply line to a body of a substrate on which the set of non-volatile storage elements is formed.

9. The method of claim 1, wherein:
the electromagnetically coupling a voltage comprises raising a voltage on a power supply line associated with the set of non-volatile storage elements.

10. The method of claim 1, wherein:
at least one unselected bit line and the at least one selected bit line are associated with respective pre-charge modules having respective voltage sources, the allowing the at least one selected bit line and the at least one unselected bit line to float comprises electrically disconnecting the at least one selected bit line and the at least one unselected bit line from the respective voltage sources, and the driving the at least one selected bit line and the at least one unselected bit line comprises electrically connecting the at least one selected bit line and the at least one unselected bit line to the respective voltage sources.

11. The method of claim 1, wherein:
the non-volatile storage elements are arranged in different NAND strings which are in communication with the set of associated bit lines.

12. A method for performing a programming operation involving a set of non-volatile storage elements and a set of associated bit lines, comprising:
in a first time period, electrically connecting the bit lines to respective voltage sources;
in a second time period which follows the first time period, floating the bit lines by electrically disconnecting the bit lines from the respective voltage sources; and
in a third time period which follows the second time period, electrically re-connecting the bit lines to the respective voltage sources and applying a program voltage to at least one of the non-volatile storage elements, the first, second and third time periods occur during a programming operation of the at least one of the non-volatile storage elements, and the programming operation is repeated in order to program the non-volatile storage elements to target data states.

13. The method of claim 12, wherein:
set of non-volatile storage elements is erasable as a unit, and all bit lines associated with the set of non-volatile storage elements are floated in the second time period.

14. The method of claim 12, further comprising:
in the third time period, applying pass voltages to unselected non-volatile storage elements of the set of non-volatile storage elements.

15. The method of claim 12, further comprising:
in the second time period, varying a voltage on a conductive element in the non-volatile storage to electromagnetically couple a voltage to the bit lines when the bit lines are floating.

16. The method of claim 15, wherein:
the conductive element comprises a source line associated with the set of non-volatile storage elements.

17. The method of claim 15, wherein:
the conductive element comprises a supply line to a body of a substrate on which the set of non-volatile storage elements is formed.

18. The method of claim 15, wherein:
the conductive element comprises a power supply line associated with the set of non-volatile storage elements.

19. A method for performing a programming operation involving a set of NAND strings, comprising:
(a) driving at least one unselected NAND string with a pre-charge voltage via a first conductive element which is electrically connected to the at least one unselected NAND string, thereby boosting a voltage of a channel region of a substrate on which the at least one unselected NAND string is formed;
(b) further boosting the voltage of the channel region by raising a voltage on a second conductive element which is proximate to a first conductive element, while floating the first conductive element and the at least one unselected NAND string, so that a portion of the raised voltage is electromagnetically coupled to the first conductive element and the at least one unselected NAND string; and
(c) after step (b), discontinuing the floating of the first conductive element, and applying a program voltage to a selected word line which is in communication with the at least one unselected NAND string.

20. The method of claim 19, further comprising:
applying pass voltages to unselected word lines which are in communication with the at least one unselected NAND string, while applying the program voltage.

21. The method of claim 19, wherein:
the first conductive element comprises a bit line and the second conductive element comprises a source line.

22. The method of claim 19, further comprising:
the first conductive element comprises a bit line and the second conductive element comprises a supply line to a body of the substrate.

23. The method of claim 19, further comprising:
the first conductive element comprises a bit line and the second conductive element comprises a power supply line.

* * * * *